(12) United States Patent
Yu (10) Patent No.: US 9,769,922 B2
(45) Date of Patent: Sep. 19, 2017

(54) WHITE COLOR COATING LAYER-FORMED TOUCH SCREEN PANEL AND WHITE COLOR COATING LAYER VACUUM COATING METHOD OF TOUCH SCREEN PANEL

(76) Inventor: Heung Sang Yu, Gimhae-si (KR)

( * ) Notice: Subject to any disclaimer, the term of this patent is extended or adjusted under 35 U.S.C. 154(b) by 425 days.

(21) Appl. No.: 14/373,885

(22) PCT Filed: Jun. 15, 2012

(86) PCT No.: PCT/KR2012/004739
§ 371 (c)(1),
(2), (4) Date: Oct. 9, 2014

(87) PCT Pub. No.: WO2013/122293
PCT Pub. Date: Aug. 22, 2013

(65) Prior Publication Data
US 2015/0034370 A1      Feb. 5, 2015

(30) Foreign Application Priority Data

Feb. 15, 2012  (KR) ................... 10-2012-0015172
Feb. 15, 2012  (KR) ................... 10-2012-0015183

(51) Int. Cl.
*C23C 14/34*   (2006.01)
*H05K 1/03*    (2006.01)
*G06F 3/041*   (2006.01)
*H05K 1/02*    (2006.01)
*H05K 3/00*    (2006.01)
*H05K 3/10*    (2006.01)
*C23C 14/04*   (2006.01)
*C23C 14/08*   (2006.01)

(52) U.S. Cl.
CPC .......... *H05K 1/0306* (2013.01); *C23C 14/34* (2013.01); *G06F 3/041* (2013.01); *H05K 1/0274* (2013.01); *H05K 1/0284* (2013.01); *H05K 3/0011* (2013.01); *H05K 3/0091* (2013.01); *H05K 3/108* (2013.01); *C23C 14/04* (2013.01); *C23C 14/08* (2013.01); *G06F 2203/04103* (2013.01); *H05K 2201/0326* (2013.01); *H05K 2201/10128* (2013.01); *H05K 2201/2054* (2013.01)

(58) Field of Classification Search
USPC ....... 427/58, 98.4, 284; 345/173; 204/192.1, 204/192.15, 192.22, 192.27, 192.29
See application file for complete search history.

(56) References Cited

U.S. PATENT DOCUMENTS 9,454,275 B2 *   9/2016  Kim ..................... G06F 3/044
2009/0096759 A1*  4/2009  Nishiwaki ............. G06F 3/041
                                                345/173

(Continued)

FOREIGN PATENT DOCUMENTS

KR  10-2007-0038841   4/2007
KR  10-2010-0054673   5/2010
(Continued)

*Primary Examiner* — Brian K Talbot
(74) *Attorney, Agent, or Firm* — Innovation Counsel LLP (57) ABSTRACT

Disclosed is a white coating layer-formed touch screen panel. The coating layer includes a glass substrate, a white coating layers selectively formed on an edge portion of the glass substrate, a black color coating layer selectively formed on an edge portion, and a transparent conductive layer formed on the glass substrate including the edge portion.

7 Claims, 4 Drawing Sheets

(56) References Cited

U.S. PATENT DOCUMENTS

| | | | | |
|---|---|---|---|---|
| 2011/0242057 A1* | 10/2011 | Lee | ............... | G06F 3/041 |
| | | | | 345/176 |
| 2011/0318553 A1* | 12/2011 | Lotz | ............... | C23C 14/34 |
| | | | | 428/212 |
| 2012/0026107 A1* | 2/2012 | Kim | ............... | G06F 3/044 |
| | | | | 345/173 |
| 2012/0256851 A1* | 10/2012 | Wang | ............... | G06F 3/041 |
| | | | | 345/173 |
| 2014/0176823 A1* | 6/2014 | Jeon | ............... | G06F 3/041 |
| | | | | 349/12 |
| 2015/0101853 A1* | 4/2015 | Lee | ............... | H05K 1/0274 |
| | | | | 174/258 |

FOREIGN PATENT DOCUMENTS

| KR | 10-2011-0053940 | 5/2011 |
|---|---|---|
| KR | 10-2011-0104225 | 9/2011 |

\* cited by examiner

WHITE COLOR COATING LAYER-FORMED TOUCH SCREEN PANEL AND WHITE COLOR COATING LAYER VACUUM COATING METHOD OF TOUCH SCREEN PANEL

CROSS-REFERENCE TO RELATED APPLICATIONS

This application claims priority to and the benefit of PCT Patent Application PCT/KR2012/004739 filed in the Korean Intellectual Property Office on Jun. 15, 2012 which claims priority to and the benefit of Korean Patent Application No. 10-2012-0015172 filed in the Korean Intellectual Property Office on Feb. 15, 2012 and Korean Patent Application No. 10-2012-0015183 filed in the Korean Intellectual Property Office on Feb. 15, 2012, the entire contents of which are incorporated herein by reference.

BACKGROUND

1. Technical Field

The inventive concept relates to a white color coating layer-formed touch screen panel, and in particular to a white color coating layer-formed touch screen panel wherein a white color coating layer is formed on a touch screen panel by a vacuum coating method.

In addition, the inventive concept relates to a white color coating layer vacuum coating method of a touch screen panel, and in particular to a white color coating layer vacuum coating method of a touch screen panel wherein a white color coating layer is formed on a touch screen panel by a vacuum coating method.

2. Background Art

According to a display device, a TSP (Touch Screen Panel) wherein an invisible electrode is integrated in a tempered glass is being developed. As an example, the Japanese patent registration 10-0974073 describes a TSP which has the same functions as a flat panel display with various advantages of the flat display device such as an electronic notepad, a LCD (Liquid Crystal Display), a PDP (Plasma Display Panel), an EL (Electroluminescence), etc. and a CRT (Cathode Ray Tube). The touch screen panel in which a user selects desired information on a display device may be categorized into a resistive type, a capacitive type and a resistive multi-touch type, etc.

The resistive type is characterized in that a resistive component is coated on a glass or a plastic, and a polyethylene film is coated on the resistive component. Insulation rods are provided at regular intervals so as to prevent two surfaces from coming into contact with each other. In terms of operational principle, current is constantly applied to both ends of a resistive film. Since the resistive film operates like a resistive component having a predetermined resistivity, voltage is applied at both ends of the resistive component. When a user touches with a finger or a touch pen, the polyester film coated on the upper surface is bent, and two surfaces are connected. A parallel connection of the resistive component is made. Thus, a resistive value varies due to the resistive components of two surfaces.

At this time, the applied voltage varies accordingly due to the current flowing at both ends. The position of the touch may be determined based on the variation of the voltage. According to the resistive type, the resolution and the response speed are high because the resistive type is configured to operate based on the surface pressure. However, it is not appropriate for multi touch and it is easily broken.

The capacitive type is characterized in that an invisible, special conductive metal (TAO) is coated on both sides of a heat-treated glass. When voltage is applied to four corners of a screen, high frequency spreads over the whole surfaces of a sensor. When a user touches the screen with a finger, the flow of electrons changes. Such a change is detected and thereby determining coordinates of the position of the touch. The capacitive type touch screen may be compatible with multiple point touches. The resolution and durability are good. However the response speed is slow and its installation is difficult.

The resistive multi-touch type is characterized in that it may be operable in the same way as the capacitive type by improving the problems found in the resistive type wherein only one touch point detection is available.

In addition, the touch screen panel (TSP) may be actually applied to each electronic product in consideration of signal amplification, a difference in resolution, difficulty in design and process technology as well as an optical characteristic of each touch screen panel, an electric characteristic, a mechanical characteristic, an environment resistant characteristic, an input characteristic, durability and economical advantage. In particular, the resistive type and the capacitive type are widely applied to an electronic notepad, a PDA, a portable PC and a mobile phone (cellular phone).

In a touch screen manufacturing technology, it needs to make thinner the thickness of the touch screen panel while obtaining good durability. By eliminating most of conventional complicated procedures, it is possible to extend the usable time of battery by decreasing power consumption. The same luminance as in the conventional products may be obtained with decreased power consumption by increasing light transmittance of the TSP.

The conventional resistive type touch screen panel has been developed.

The above-mentioned resistive type touch screen panel comprises a window film (or overlay film) disposed on a surface of the LCD, and first and second ITO films which are attached to a lower surface of the window film for electrically inputting information in a liquid display module. The window film is provided so as to protect the first ITO film and is generally made of a PET (Polyethylene Terephthalate). The first ITO film is attached to the window film (or overlay film) by means of an OCA (Optical Clear Adhesive). On the first ITO film and the second ITO film, first and second electrode layers which use silver on each edge are formed. A double side tape is attached between the first and second electrode layers for insulation. They are spaced apart by a predetermined interval by means of a dot spacer and are electrically connected when a pressure (touch) is externally applied using a finger or a touch pen for thereby detecting accurate touch position.

A lamination process forming an OCA (Optical Clear Adhesive) between the window film (or overlay film) and the first ITO film lowers light transmittance of the TSP. A predetermined process for arranging the window film (or overlay film) and attaching it to the first ITO film using the OCA makes the processes complicated and raises the costs for processes.

According to the above-described technology, the ITO layer is patterned through a laser wet etching, so it is possible to selectively coat the ITO in a predetermined region of the window film (or PET film).

In the Korean patent publication number 10-0893499 (Apr. 17, 2009), there is provided a touch panel.

The above mentioned touch panel comprises a first conductive unit including a first substrate, a first ITO coating layer coated on a lower surface of the first substrate, and a first electrode printed on an edge of the lower surface of the first ITO coating layer; and a second conductive unit including a second substrate, a second ITO coating layer coated on an upper surface of the second substrate, and a second electrode printed on an edge of an upper surface of the second ITO coating layer. With the above mentioned construction, it is possible to enhance light transmittance of the touch panel while decreasing the thickness of the touch panel and manufacturing cost, which results in slimed design products.

The above-described technology is characterized in that since the first and second ITO (invisible electrode) are coated on the first and second substrates (tempered glass), a predetermined strength high enough to withstand against external impacts may be obtained, and an overlay film (or window film) may be eliminated; whereas the tempered glass is a key element when manufacturing the touch screen panel (TCP). The tempered glass may cause defect in the TSP and may be broken and scattered when impacts are externally applied to the tempered glass. In order to overcome the scattering problems, there are provided second and third embodiments wherein a conductive unit protection part is provided on the top of the first electrode (tempered glass) so as to allow it to play a role of the scattering prevention film. However, there is still a problem in making a thinner touch panel.

In order to overcome the above mentioned problems, in the Korean patent publication number 10-0974073, there is provided a method for manufacturing a window touch screen panel which comprises a step for manufacturing a window ITO film (window indium tin oxide film) by a sputtering method to integrate a window film used so as to protect an ITO film (Indium Tin Oxide Film) with the ITO film; and a step for manufacturing an upper substrate in such a way that a first invisible printed layer is formed so as to protect the printing of the first electrode layer and the printed terminals of the first electrode layer by patterning an electric wire circuit on a lower surface of the manufactured window ITO film layer. In addition, a double side tape having an insulation property is used to attach the first electrode layer of the upper substrate and the second electrode layer of the lower substrate. In case of the double side tape, there is provided a preparation process for combining the upper and lower substrates, which is performed through a step for cutting the double side tape to the sizes of the upper and lower substrates, a step for forming a guide hole with a diameter of 0.8 mm to match the central reference point of the cut double side tape, a step for half-cutting for peeling an invisible region of each of the substrates, and a step for removing and peeling the unnecessary double side tape of the half-cut invisible region. In addition, there are further provided a step for forming a dot spacer on an upper surface of an ITO tempered glass layer on which an ITO is coated. The dot spacer has function of preventing a contact between the upper substrate and the lower substrate at usual time, of permitting electric conduction when a pressure is inputted from a touch pen or a finger, and of elastically recovering the upper substrate when the inputted pressure is removed; a step for manufacturing a lower substrate by forming a second invisible printed layer which protects the printing of a second electrode layer and a printed terminal of the second electrode layer in such a way that it is arranged at a predetermined interval from the upper substrate, and an electric wire circuit is patterned on an upper surface of the ITO tempered glass layer; a step for laminating a polycarbonate (PC) on a lower surface of the ITO tempered glass layer of the lower substrate; and a step for performing after lamination a computer numerical control (CNC) to see whether it is sized or cut for the cell size of the film.

In the Korean patent publication registration number 10-0997712, there is provided a window touch screen panel which is arranged at an interval from a lower substrate and comprises an upper substrate including a window film configured to protect an ITO film, a window ITO film layer manufactured by a sputtering method in such a way to integrate the ITO film having a detection electrode function, a first electrode layer printed by patterning an electrical wire circuit on a lower surface of the window ITO film layer, and a first invisible printed layer configured to protect the printed terminal of the first electrode layer; a lower substrate which is arranged at an interval from the upper substrate and includes an ITO tempered glass layer wherein an ITO having a detection electrode function is coated on the tempered glass, a second electrode layer printed by patterning an electrical wire circuit on an upper surface of the ITO tempered glass layer, and a second invisible printed layer configured to protect the printed terminal of the second electrode layer; a double side tape which has a guide hole with a diameter of 0.8 mm sized to match the central reference point of the cut adhering member in a state that the adhering member is cut to match the sizes of the upper and lower substrates, a half-cut function wherein a score cutting is performed before an invisible region peeling of the upper and lower substrates, and an insulation property as it adheres the first electrode layer of the upper substrate and the second electrode layer of the lower substrate after the unnecessary portions of the half-cut invisible regions are removed; and a dot spacer which is configured to make electrical conduction when a pressure is inputted from a touch pen or a finger while preventing at usual time a contact between the upper substrate and the lower substrate, and which is also configured to elastically recover the upper substrate when the pressure is removed.

In the Korean patent publication number 10-2010-0054673, there are provided an ITO film deposited on an upper surface of a flexible plastic film, a first metallic layer deposited on the ITO film, and a second metallic layer plated on the first metallic layer. The touch screen with a good sensitivity and the method for manufacturing the same provide durability.

In the Korean patent registration number 10-1011334, there is provided a touch panel characterized in that an invisible insulation film of an upper electrode member in a touch panel of a film/glass construction has an upwardly slanted cross section around its whole portions, and an invisible insulation film of an upper electrode member of a touch panel of the film/film construction and an invisible insulation film of a lower electrode member have an upwardly slanted cross section around its whole portions.

In the above-described conventional touch screen product, since the ITO coating film or the ITO coating glass is adhered to the backside of a glass including the screen printed layer, the manufacture cost is high, and manufacturing procedures are complicated. In addition, the white color coating layer formed on the touch screen is just painted on a rim of the touch screen or is printed by a silk screen method, so the thickness is thicker than the central portion of the touch screen. The difference between the heights of the portions where the rim portion meets and the central portion is high, so defective products may increase, and manufacturing procedures are not easy and are complicated.

SUMMARY

Accordingly, it is an object of the inventive concept to provide a touch screen panel characterized in that the touch screen panel is thin and has durability because a white color coating layer is formed on a touch screen panel by a vacuum coating method, and defective products decrease.

It is another object of the inventive concept to provide a touch screen panel characterized in that the thickness of the touch screen panel is thinner, and work procedures are simple, and manufacture costs are low.

To achieve the above objects, there is provided a touch screen panel wherein a white color coating layer is formed, comprising coating layers which are in order formed by a vacuum coating method on a back surface of a glass plate 10, wherein the coating layers are differently formed at a central portion and a rim portion of a back surface of the glass plate 10, and in the coating layer formed at the central portion, a $SiO_2$ coating layer 50 and an ITO coating layer 60 are in order formed, and in the coating layer formed at the rim portion which corresponds to a white color coating and is sand-processed or etched for thereby forming a protruded portion on which a MgO coating layer 20, an Ag coating layer 30, a TiO+SiO or $SiO_2+SiO_2+TiO_2$ coating layer 40, a $SiO_2$ coating layer 50 and an ITO coating layer 60 are formed in order.

To achieve the above objects, there is provided a white color coating layer vacuum coating method of a touch screen panel, comprising masking part of a back surface of a glass plate 10 of a touch screen panel; forming a protruded portion by sand-processing or etching a back surface of the glass where is not masked; forming a MgO coating layer 20 by first coating MgO by a vacuum deposition method or a sputtering method; forming an Ag coating layer 30 by coating Ag by a sputtering method; forming a TiO+SiO or $SiO_2\pm TiO_2$ layer 40 by coating a TiO+SiO or $SiO_2+TiO_2$ by a sputtering method; removing a masking; forming a $SiO_2$ coating layer 50 by a sputtering method on the whole portions of a back surface of the glass plate 10 including the TiO+SiO or $SiO_2+TiO_2$ layer; and forming an ITO coating layer 60 by a sputtering method on the whole portions of the $SiO_2$ coating layer 50.

The white color coating layer of the touch screen panel by the vacuum coating method of the inventive concept is thinner and has durability, and defective products decrease.

In the inventive concept, the touch screen panel is thin, and work procedures are simple, and manufacture cost is low, and the white color coating layer of the touch screen panel may be vacuum coated.

DETAILED DESCRIPTION

Figure 1:
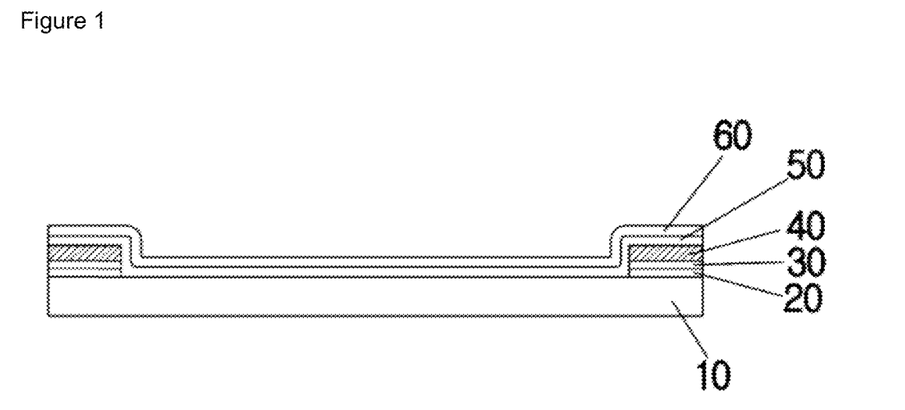
FIG. 1 is a cross sectional view of a touch screen panel manufactured by a vacuum deposition coating method according to the inventive concept.

The inventive concept is directed to a white color coating layer-formed touch screen panel. The white color coating layer-formed touch screen panel according to the inventive concept includes a coating layer i formed on a back surface of a glass plate 10 by a vacuum coating method. The coating layer is formed to have a different configuration at a central portion and a rim portion of the back surface of the glass plate 10. In the coating layer of the central portion, an insulating layer such as $SiO_2$ coating layer 50 and an transparent conductive layer such as ITO and ZTO coating layer 60 are sequentially formed. The coating layer on the rim portion is a white color coating layer. On the glass plate 10 on the rim portion, a white coating layer such as a MgO coating layer 20, a reflective layer such as an Ag coating layer 30, a black coating such as TiO+SiO and $SiO_2+SiO_2+TiO_2$ coating layer 40, an insulating layer such as $SiO_2$ coating layer 50 and a transparent conductive layer such as an ITO coating layer 60 are sequentially formed.

The $SiO_2$ coating layer 50 and the ITO coating layer 60 are formed over the central portion of the back surface of the glass plate and the rim portions.

Instead of the MgO coating layer 20, a white oxide such as a CaO, $TiO_2$, $SrO_2$, $Al_2O_3$ and $Y_2O_3$ may be formed.

Instead of the Ag coating layer 30, an Al coating layer may be formed.

Figure 2:
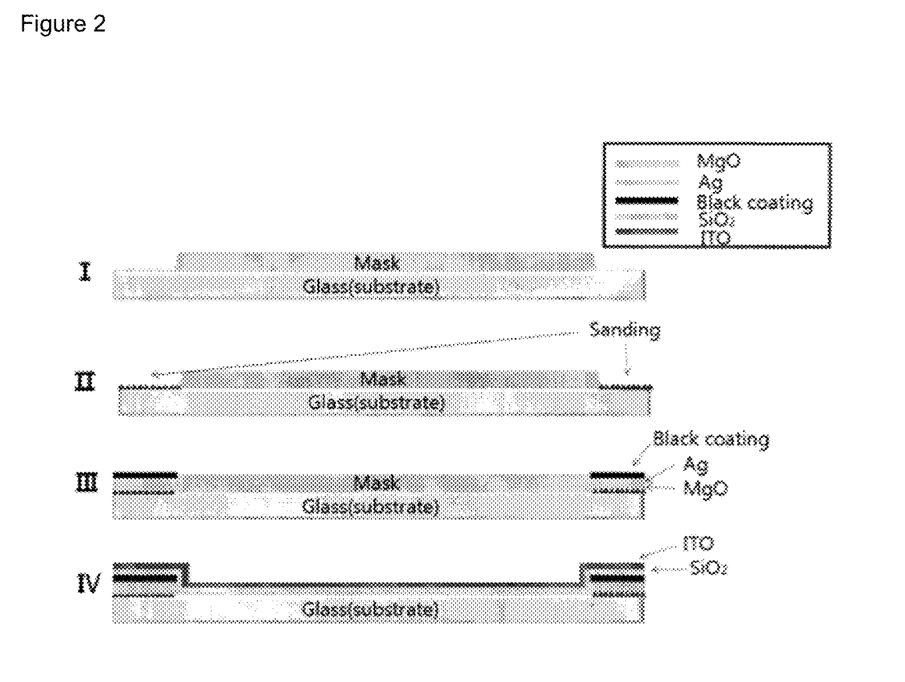
FIG. 2 is a flow chart of a vacuum deposition coating method according to the inventive concept.

The white color coating layer may be formed by a vacuum coating method. The vacuum coating method may include masking part of a back surface of a glass plate 10 of a touch screen panel by a mask; forming a protruded portion in the glass plate 10 by sand-processing or etching on which the mask is not covered; forming a MgO coating layer 20 by a vacuum deposition method or a sputtering method; forming an Ag coating layer 30 by a sputtering method; forming a TiO+SiO or $SiO_2\pm TiO_2$ layer 40 by a sputtering method; removing the mask; forming a $SiO_2$ coating layer 50 by a sputtering method on the whole portions of a back surface of the glass plate 10 including a portion coated by the TiO+SiO or $SiO_2+TiO_2$ layer; and forming an ITO coating layer 60 by a sputtering method on the whole portions of the $SiO_2$ coating layer 50.

The glass plate 10 may be quadrangle. The mask may be quadrangle too.

The grain size of the protruded portion may be smaller than 500 mesh.

In the step for forming the MgO coating layer 20, a coating layer of white oxide such as CaO, $TiO_2$, $SrO_2$, $Al_2O_3$ and $Y_2O_3$ may be formed instead of MgO.

In the step for forming the Ag coating layer 30, the Al coating layer may be formed instead of Ag.

Figure 3:
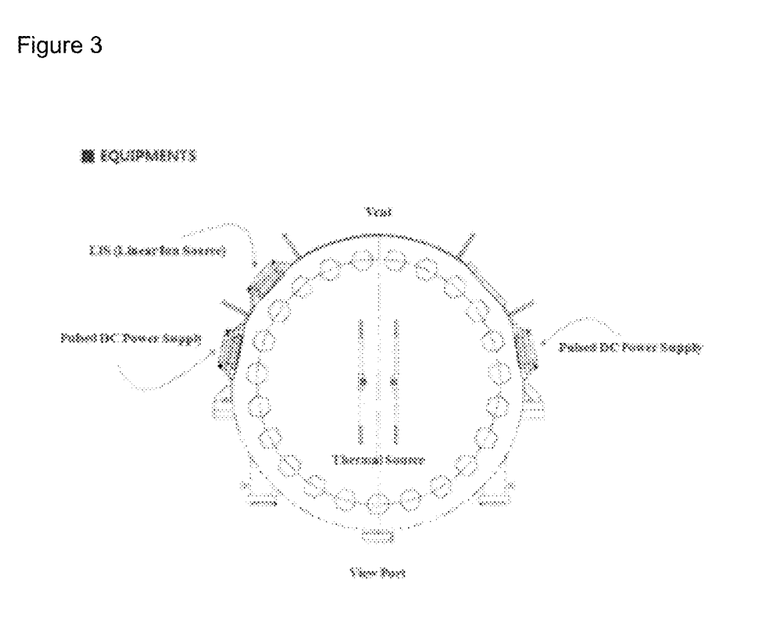
FIG. 3 is a view illustrating an arrangement of a vacuum deposition apparatus according to the inventive concept.
Figure 4:
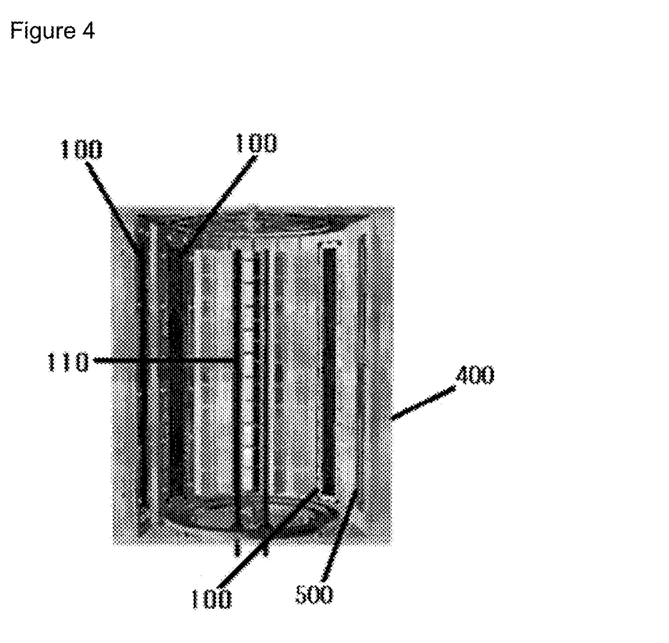
FIG. 4 is a schematic view illustrating an inner construction of a vacuum deposition apparatus wherein a sputter module, a linear ion source and a thermal evaporation source are installed according to the inventive concept.
Figure 5:
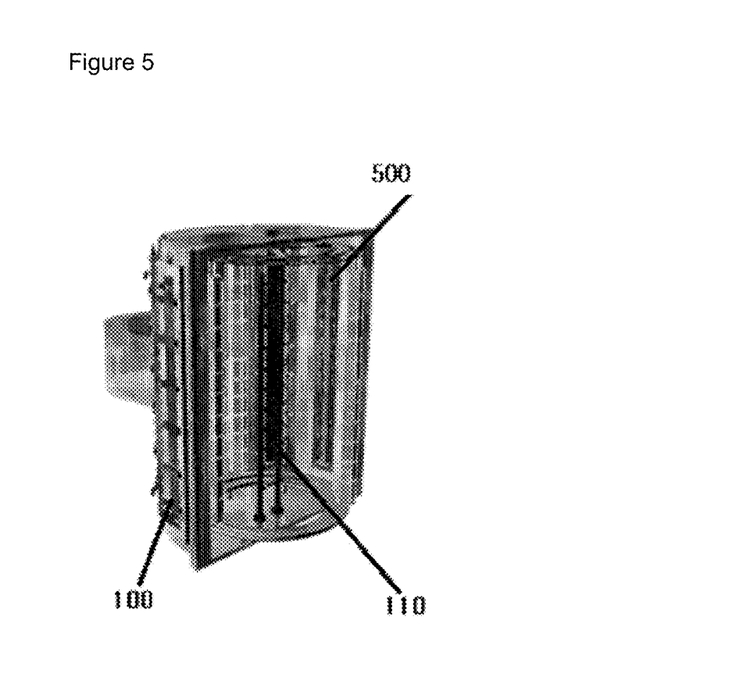
FIG. 5 is a schematic cut-away view illustrating a vacuum deposition apparatus wherein a sputter module, a linear ion source and a thermal evaporation source are installed according to the inventive concept.
Figure 6:
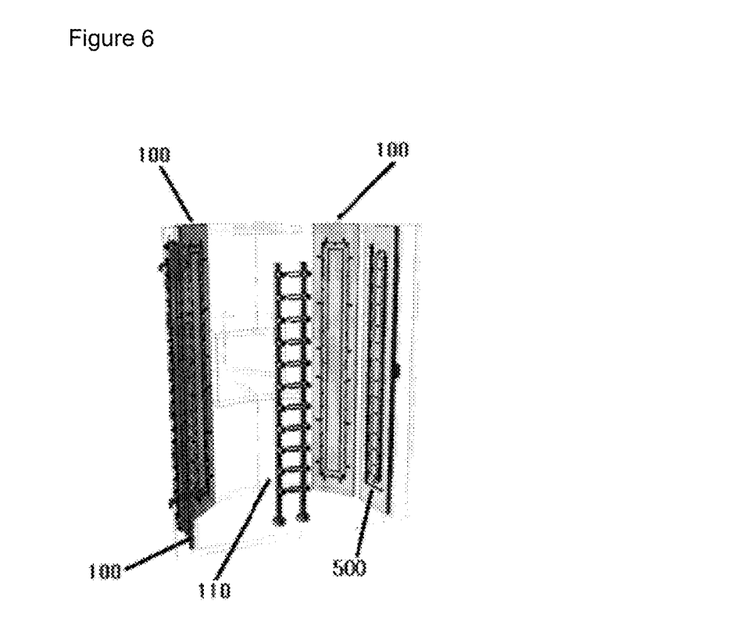
FIG. 6 is a schematic disassembled view illustrating a vacuum deposition apparatus wherein a sputter module, a linear ion source and a thermal evaporation source are installed according to the inventive concept.
Figure 7:
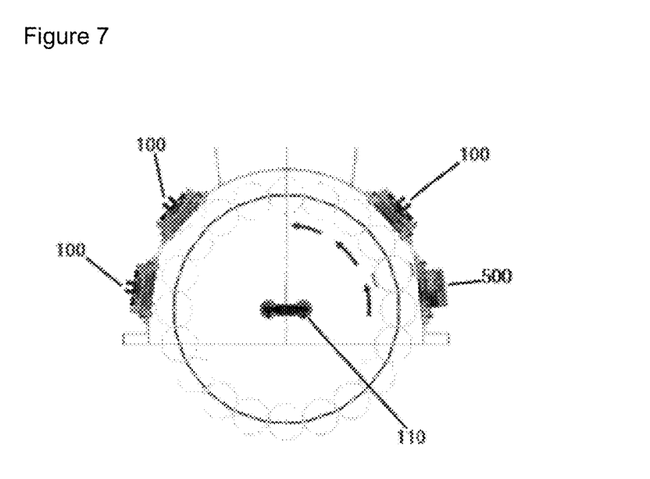
FIG. 7 is a schematic plane view illustrating a vacuum deposition apparatus wherein a sputter module, a linear ion source and a thermal evaporation source are installed according to the inventive concept.
Figure 8:
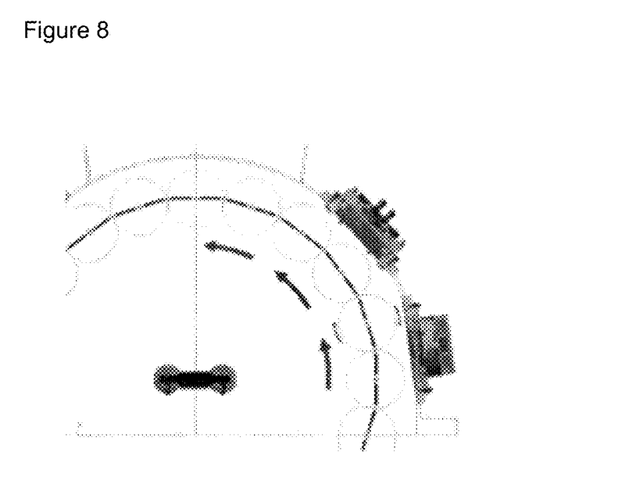
FIG. 8 is a partially enlarged view of FIG. 7.

The exemplary embodiments of the inventive concept will be described in details with reference to the accompanying drawings. FIG. 1 is a cross sectional view of a touch screen panel manufactured by a vacuum deposition coating method according to the inventive concept. FIG. 2 is a flow chart of a vacuum deposition coating method according to the inventive concept. FIG. 3 is a view illustrating an arrangement of a vacuum deposition apparatus according to the inventive concept. FIG. 4 is a schematic view illustrating an inner construction of a vacuum deposition apparatus wherein a sputter module, a linear ion source and a thermal evaporation source are installed according to the inventive concept. FIG. 5 is a schematic cut-away view illustrating a vacuum deposition apparatus wherein a sputter module, a linear ion source and a thermal evaporation source are installed according to the inventive concept. FIG. 6 is a schematic disassembled view illustrating a vacuum deposition apparatus wherein a sputter module, a linear ion source and a thermal evaporation source are installed according to the inventive concept. FIG. 7 is a schematic plane view illustrating a vacuum deposition apparatus wherein a sputter module, a linear ion source and a thermal evaporation source are installed according to the inventive concept. FIG. 8 is a partially enlarged view of FIG. 7.

In the white color coating layer-formed touch screen panel according to the inventive concept, the coating layer formed by a vacuum coating method is sequentially formed on a back surface of a glass plate 10. In the coating layer, the heights of the central portion and the rim portion of the back surface of the glass plate 10 are different.

In the coating layer of the central portion, there are sequentially formed a $SiO_2$ coating layer 50 and an ITO coating layer 60, and in the coating layer of the rim portion which is a white color coating layer, there are formed a MgO coating layer 20, an Ag coating layer 30, a TiO+SiO or $SiO_2$+$TiO_2$ coating layer 40, a $SiO_2$ coating layer 50 and an ITO coating layer 60.

In addition, the $SiO_2$ coating layer 50 and the ITO coating layer 60 are formed by a vacuum coating method over the central portion of the back surface of the glass plate and the whole rim portions.

In the inventive concept, part of the back surface of the touch screen panel glass plate 10 except the rim portions is first covered by a mask. The mask is formed using a metallic plate or a silk screen printing. The portions which are not masked in the back surface of the glass are sand-processed or etched thereby forming a protruded portion. The reason the protruded portion is formed is that light may be well scattered by the protruded portion.

The MgO coating layer 20 is formed by coating, by a vacuum deposition method or a sputtering method, after forming the protruded portion. The MgO has white color because scattered light from the protruded portion is incident on the MgO. The MgO is white oxide. Instead of using the MgO, one white oxide selected from the group consisting of CaO, $TiO_2$, $SrO_2$, $Al_2O_3$ and $Y_2O_3$ may be used.

A reflective coating layer such as Ag coating layer 30 is formed by a sputtering method on the MgO coating layer. Here, the Ag coating layer 30 may prevent white light from being incident on a glass surface of the front surface opposite to the back surface.

Without the reflective coating layer, the white light may leak and it is impossible to obtain an accurate white color with the aid of the protruded portion and the MgO coating layer because the light is interfered with the leaking light. The Al coating layer may be formed by a sputtering method instead of Ag.

Next, the TiO+SiO or $SiO_2$+$TiO_2$ layer 40 is formed by a sputtering method on the Ag coating layer 30. The TiO+SiO or $SiO_2$+$TiO_2$ layer is called as a black coating because it has black color and a non-conductive characteristic. Next, the mask is removed, and a $SiO_2$ coating layer 50 is formed by a sputtering method over the whole portions of the back surface of the glass plate 10 including the TiO+SiO or $SiO_2$+$TiO_2$ layer.

In the final step, the ITO coating layer 60 is formed by a sputtering method over the whole portions of the $SiO_2$ coating layer 50.

In the inventive concept, the glass plate 10 of the touch screen panel may be quadrangle. The mask may be a quadrangle and covers the central portion except the rims of the glass plate 10.

The grain size of the protruded portion which is sand-processed or etched is smaller than 500 mesh.

The manufacturing method according to the inventive concept will be described in details.

Part of the back surface of the glass plate is covered by a mask. The masking process is performed using a metallic plate or a silk screen printing. If the metallic plate is used as a masking material, a magnet is attached to the front surface of the glass so that the metallic plate is fixed to the back surface of the glass, thus, the mask is not disengaged from the back surface.

The back surface of the glass where is not covered by the mask is sand-processed or etched. Scattered reflection of incident light occurs on the sand-processed or etched surface. The sand-processed or etched surface may help scattering of incident light. Thereafter, the coating is performed. The protrusion where is sand-processed or etched should be smaller than 500 mesh.

MgO is first coated by either a vacuum deposition or sputtering method. Thereafter, Ag is coated by a sputtering method.

The black coating is obtained by coating TiO+SiO or $SiO_2$+$TiO_2$ by a sputtering method.

$SiO_2$ is coated by a sputtering method on the whole portions of the back surface of the glass plate. Here, $SiO_2$ coating is performed for the sake of insulation effect and translucency.

In addition, ITO conductive coating is coated by a sputtering method on the $SiO_2$-coated portion. The ITO coating is performed for the sake of conductive effects.

The inventive concept will be described with regard to a manufacturing apparatus. The coating of the white color coating may be performed using an apparatus having a LIS (Linear Ion Source), a thermal source and a sputter module.

Alternatively, it may be possible to provide other equipment which has the same function as the above-described function and implement through other processes. It is efficient and economical to perform necessary procedures in one apparatus having the LIS (Linear Ion Source), the thermal source and the sputter module in one vacuum chamber.

The LIS is used for pretreatment. The sand-processed glass is inputted in the vacuum chamber and is cleaned by means of the LIS.

After the cleaning is performed using the LIS, MgO is coated by a vacuum deposition or sputtering method using the thermal source installed at the center. After the MgO is coated, Ag is coated by a sputtering method, and a TiO+SiO or $SiO_2$+$TiO_2$ which is the black coating layer is coated thereon by a sputtering method.

The white color coating of the inventive concept will be described. When light is scanned onto the back surface of the glass, the transmissivity of light is 0% due to the black layer. On the contrary, when light is scanned onto the front surface of the glass, the light does not transmit due to the Ag layer and reflects substantially 100%. In addition, the reflected light turns white light due to scattered reflection effects against the MgO layer and the sand-processed glass surface.

The thickness of the white color coating layer is below 4.5 µm, and resistance is equal to or above 70/cm², and the average transmissivity is below 0.3%.

For the sake of efficient coating, the vacuum coating apparatus used in the inventive concept may be equipped with a resistive thermal evaporation source at the center of the chamber.

The linear ion source is installed on a wall of the chamber, so the pretreatment process of the sample using Ar and the cleaning process are performed.

In addition, the sputtering method used in the inventive concept is a typical sputtering technology. Ar positive ions generated in the plasma state are accelerated toward the target placed on the cathode by means of the electric field applied to the cathode installed in the sputter module and collide with the target, so the atoms of the target sputters on to the glass plate 10.

The sputtering does not have a heating procedure and even a high melting metal like tungsten may be deposited without an aid of heat. A metal may be heated and evaporated in a typical vacuum deposition method. However, in case of an alloy, the vapor pressures of the components of the alloy are different, which may make it difficult to make a deposition of the alloy using an evaporation method. On the contrary, the sputtering may be used to form a thin metal as well as an inorganic substance like quartz.

The sputtering apparatus comprises a double-pole electrode and performs a flow discharge while emitting Ar gas. The substance to be deposited is made into a circular or rectangular target. When negative high voltage is applied to the target, target atoms sputtered due to the collisions of $Ar^+$ ion are collected on a surface of the substrate thereby a thin layer may be formed.

Since the flying speed of the target atoms in the sputtering method are 100 times faster than in the evaporation which is the vacuum deposition method, an adhering strength of the thin layer and the substrate is strong. In addition to the double pole sputtering, there are a quadrupole sputtering method wherein plasma generates by a cathode and an anode between the substrate and the target, a RF method which uses a high frequency, and a magnetron sputtering method which uses a magnetic field.

The basic principles of the sputtering method and the resistive heating method are described in the Korean patent registration number 20-0185068 which was filed by the same applicant as the subject invention and was issued and discloses the basic principles of the sputtering method and the resistive heating method. According to the above-mentioned disclosure, the target to be sputtered is installed at the cathode of the sputter module using a clamp.

Here, the evaporator is configured to perform coating by melting and evaporating a predetermined coating substance by the resistive heating method or the electron beam method. A deposited substance may be deposited by sputtering and dispersing of the coating substance.

The resistive heating method uses a heating method wherein Joule's heat generates by flowing current through a resistor. Here, both a direct method of heating by directly flowing current through a substance and an indirect method of transferring the heat of a heating substance to a heated substance by means of a radiation and convection method may be used.

The plasma or glow discharges are characterized in that a plasma or glow discharge band are formed by means of an inert gas and a low pressure and voltage spark supplied from an electric power supply apparatus between the above mentioned discharge means. In this state, an inner cylinder rotates, and a coating portion of a substance to be coated mounted on a holder is passed through the discharge band for thereby performing a coating. At the same time, a coating substance melted by the sputtering target and the evaporator disperses or sputters, so a thin layer in a multiple structure is formed on the deposited substance.

The deposition process of the substance may be summarized as follows. The substrate to be deposited is mounted on the holder of the inner cylinder. The vacuum deposition chamber is vacuum-exhausted using a vacuum exhaustion apparatus such as vacuum pump. When the interior of the chamber becomes a vacuum state, the inner cylinder with the holder is rotated. A deposition substance which is melted and dispersed from the evaporator, and is sputtered from the sputtering target is uniformly deposited on the surface of the substance to be deposited.

The inventive concept includes the white color coating layer of the touch screen panel by a vacuum coating method which is thin and durable, and have few defect.

In the touch screen panel wherein a white color coating layer is formed according to the inventive concept, the coating layers are sequentially coated on a back surface of the glass panel in the touch screen panel. The coating layers are formed in such a way that the central portion and the rim portion of the back surface of the glass plate 10 are differently coated.

The coating layers of the central portion are formed in such a way that a $SiO_2$ coating layer 50 and an ITO coating layer 60 are sequentially formed. The coating layers of the rim portion are a white color layer including MgO coating layer 20, an Ag coating layer 30, a TiO+SiO or $SiO_2$+$SiO_2$+$TiO_2$ coating layer 40, a $SiO_2$ coating layer 50 and an ITO coating layer 60 which are sequentially formed.

In addition, the $SiO_2$ coating layer 50 and the ITO coating layer 60 are formed in the central portion and the whole rim portions of the back surface of the glass plate.

In the inventive concept, part of the back surface of the touch screen panel glass plate 10 is first covered by a mask. The masking is performed using a metallic plate or a silk screen printing. The portion of the back surface of the glass which is not covered by the mask is sand-processed or etched for thereby forming a protruded portion. The reason that the protruded portion is formed is that light may be easily scattered by the protruded portions.

Next, a white metal layer such as a MgO coating layer 20 is selectively formed on the rim portion by a vacuum deposition method or a sputtering method on a back surface of the glass where the protruded portions are formed by sand-processing and etching. MgO is combined with the scattering light of the protruded portions and turns white color. MgO is a white color oxide. Instead of MgO, any of CaO, $TiO_2$, $SrO_2$, $Al_2O_3$, $Y_2O_3$, etc. may be used.

Next, the Ag coating layer 30 is selectively formed by a sputtering method on the rim portion by coating Ag on the MgO coating layer. Here, the Ag coating layer 30 may prevent white light from being incident on a glass surface of the top.

Without the reflective coating layer, the white light leaks and it is impossible to obtain an accurate white color with the aid of the protruded portion and the MgO coating layer because the light is interfered with the leaking light. The Al coating layer may be formed by a sputtering method instead of Ag.

Next, the TiO+SiO or $SiO_2$+$TiO_2$ layer 40 is selectively formed on the rim portion by a sputtering method on the Ag coating layer 30. The TiO+SiO or $SiO_2$+$TiO_2$ layer is called as a black coating. Next, the mask is removed, and a $SiO_2$ coating layer 50 is formed by a sputtering method over the whole portions of the back surface of the glass plate 10 including the TiO+SiO or $SiO_2$+$TiO_2$ layer.

In the final step, the ITO coating layer 60 is formed by a sputtering method over the whole portions of the $SiO_2$ coating layer 50.

In the inventive concept, the glass plate 10 of the touch screen panel is quadrangle. The mask may be a quadrangle and covers the central portion except for the rims of the glass plate 10.

The grain size of the protruded portion which is sand-processed or etched is smaller than 500 mesh.

The manufacturing method according to the inventive concept will be described in details.

Part of the back surface of the glass plate is covered by a mask. The masking process is performed using a metallic plate or a silk screen printing. If the metallic plate is used as the mask, a magnet is attached to the front surface of the glass so that the metallic plate is fixed to the back surface of the glass, thus, the mask is not disengaged from the back surface.

The back surface of the glass where is not covered by the mask is sand-processed or etched. Scattered reflection of incident light occurs on the sand-processed or etched surface. The sand-processed or etched surface may help scattering of incident light. Thereafter, the coating is performed. The protrusion where is sand-processed or etched should be smaller than 500 mesh.

MgO is first coated by either a vacuum deposition or sputtering method. Thereafter, Ag is coated by a sputtering method.

The black coating is obtained by coating TiO+SiO or $SiO_2$+$TiO_2$ by a sputtering method.

$SiO_2$ is coated by a sputtering method on the whole portions of the back surface of the glass plate. Here, $SiO_2$ coating is performed for the sake of insulation effect and translucency.

In addition, ITO conductive coating is coated by a sputtering method on the $SiO_2$-coated portion. The ITO coating is performed for the sake of conductive effects.

The inventive concept will be described with regard to a manufacturing apparatus. The coating of the white color coating may be performed using an apparatus having a LIS (Linear Ion Source), a thermal source and a sputter module.

Alternatively, it may be possible to provide other equipment which has the same function as the above-described function and implement through other processes. It is more efficient and economical to perform necessary procedures having the LIS (Linear Ion Source), the thermal source and the sputter module in one vacuum chamber.

The LIS is used for pretreatment. The sand-processed glass is inputted in the vacuum chamber and is cleaned by means of the LIS.

After the cleaning is performed using the LIS, MgO is coated by a vacuum deposition or sputtering method using the thermal source installed at the center. After the MgO is coated, Ag is coated by a sputtering method, and a TiO+SiO or $SiO_2$+$TiO_2$ which is the black coating layer is coated thereon by a sputtering method.

The white color coating of the inventive concept will be described. When light is scanned onto the back surface of the glass, the transmissivity of light is 0% due to the black layer. On the contrary, when light is scanned onto the front surface of the glass, the light does not transmit due to the Ag layer and reflects substantially 100%. In addition, the reflected light turns white light due to scattered reflection effects against the MgO layer and the sand-processed glass surface.

The thickness of the white color coating layer is below 4.5 μm, and resistance is equal to or above 7 $\Omega/cm^2$, and the average transmissivity is below 0.3%.

For the sake of efficient coating, the vacuum coating apparatus used in the inventive concept may be equipped with a resistive thermal evaporation source at the center of the chamber.

The linear ion source is installed on a wall of the chamber, so the pretreatment process of the sample using Ar and the cleaning process are performed.

In addition, the sputtering method used in the inventive concept is a typical sputtering technology Ar positive ions generated in the plasma state are accelerated toward the target placed on the cathode by means of the electric field applied to the cathode installed in the sputter module and collides with the target, so the atoms of the target sputters onto the glass plate 10.

The sputtering does not have a heating procedure and even a high melting metal like tungsten may be deposited without an aid of heat. A metal may be heated and evaporated in a typical vacuum deposition method. However, in case of an alloy, the vapor pressures of the components of the alloy are different, which may make it difficult to make a deposition of the alloy using an evaporation. On the contrary, the sputtering may be used to form a thin metal as well as an inorganic substance like quartz.

The sputtering apparatus comprises a double-pole electrode and performs a flow discharge while emitting Ar gas. The substance to be deposited is made into a circular or rectangular target. When negative high voltage is applied to the target, target atoms sputtered due to the collisions of $Ar^+$ ion are collected on a surface of the substrate thereby a thin layer may be formed.

Since the flying speed of the target atoms in the sputtering method are 100 times faster than in the evaporation which is the vacuum deposition method, an adhering strength of the thin layer and the substrate is strong. In addition to the double pole sputtering, there are a quadrupole sputtering method wherein plasma generates by a cathode and an anode between the substrate and the target, a RF method which uses a high frequency, and a magnetron sputtering method which uses a magnetic field.

The basic principles of the sputtering method and the resistive heating method are described in the Korean patent registration number 20-0185068 which was filed by the same applicant as the subject invention and was issued and discloses the basic principles of the sputtering method and the resistive heating method. According to the above-mentioned disclosure, the target to be sputtered is installed at the cathode of the sputter module using a clamp.

Here, the evaporator is configured to perform coating by melting and evaporating a predetermined coating substance by the resistive heating method or the electron beam method. A deposited substance may be deposited by sputtering and dispersing of the coating substance.

The resistive heating method uses a heating method wherein Joule's heat generates by flowing current through a resistor. Here, both a direct method of heating by directly flowing current through a substance and an indirect method of transferring the heat of a heating substance to a heated substance by means of a radiation and convection method may be used.

The plasma or glow discharges are characterized in that a plasma or glow discharge band are formed by means of an inert gas and a low pressure and voltage spark supplied from an electric power supply apparatus between the above mentioned discharge means. In this state, an inner cylinder rotates, and a coating portion of a substance to be coated mounted on a holder is passed through the discharge band for thereby performing a coating. At the same time, a coating substance melted by the sputtering target and the evaporator disperses or sputters, so a thin layer in a multiple structure is formed on the deposited substance.

The deposition process of the substance may be summarized as follows. The substrate to be deposited is mounted on the holder of the inner cylinder. The vacuum deposition chamber is vacuum-exhausted using a vacuum exhaustion apparatus such as vacuum pump. When the interior of the chamber becomes a vacuum state, the inner cylinder with the holder is rotated. A deposition substance which is melted and dispersed from the evaporator, and is sputtered from the sputtering target is uniformly deposited on the surface of the substance to be deposited.

The inventive concept providing the touch screen panel which is thin, simple manufacturing procedures, and low manufacturing cost by vacuum depositing the white color coating layer of the touch screen panel.

What is claimed is:

1. A method of forming a touch screen panel comprising:
    forming a mask layer at a center portion of a back surface of a glass substrate of the touch screen panel except an edge portion;
    foil ling a protruded portion by sand-processing or etching the back surface of the glass substrate on the edge portion;
    forming a white coating layer on the protruded portion by a vacuum deposition method or a sputtering method;
    forming a reflective layer on the white coating layer by a sputtering method;
    forming a black coating layer on the reflective layer by a sputtering method;
    removing the mask layer;
    forming an insulating layer on the center portion and the edge portion by a sputtering method; and
    forming a transparent conductive layer on the insulating layer by a sputtering method.

2. The method of claim 1, wherein a size of the protruded portion is smaller than 500 mesh.

3. The method of claim 1, wherein the white coating layer is one selected from the group consisting of MgO, CaO, TiO2, SrO2, Al2O3 and Y2O3.

4. The method of claim 1, wherein the reflective layer is one selected from the group consisting of Ag and Al.

5. The method of claim 1, wherein the black coating layer is one selected from the group consisting of TiO+SiO and TiO2+SiO2.

6. The method of claim 1, wherein the insulating layer is SiO2.

7. The method of claim 1, wherein the transparent conductive layer is ITO.

* * * * *